(12) United States Patent
Kitade

(10) Patent No.: US 6,817,093 B2
(45) Date of Patent: Nov. 16, 2004

(54) ELECTRONIC COMPONENT AND MANUFACTURING METHOD THEREFOR

(75) Inventor: Kazuhiko Kitade, Kaga (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/791,104

(22) Filed: Feb. 22, 2001

(65) Prior Publication Data

US 2001/0036684 A1 Nov. 1, 2001

(30) Foreign Application Priority Data

Feb. 22, 2000 (JP) ......................................... 2000-044021

(51) Int. Cl.[7] ................................................ H05K 3/34
(52) U.S. Cl. ............................ 29/852; 29/832; 29/840; 29/841; 29/842; 29/843; 29/846; 438/107; 438/110; 257/659; 361/818
(58) Field of Search ......................... 29/832, 835, 840, 29/841, 842, 843, 846, 852, 855; 438/106, 107, 110, 113; 174/52.1; 361/816, 818; 257/659; 228/179, 180.1, 180.21

(56) References Cited

U.S. PATENT DOCUMENTS

| | | | |
|---|---|---|---|
| 4,494,095 A | | 1/1985 | Noji et al. |
| 4,838,475 A | * | 6/1989 | Mullins et al. |
| 4,916,805 A | | 4/1990 | Ellrich et al. |
| 4,951,400 A | | 8/1990 | Elliott et al. |
| 4,959,505 A | | 9/1990 | Ott |
| 5,217,922 A | | 6/1993 | Akasaki et al. |
| 5,219,794 A | | 6/1993 | Satoh et al. |
| 5,317,803 A | | 6/1994 | Spigarelli et al. |
| 5,357,673 A | | 10/1994 | Polak et al. |
| 5,394,011 A | * | 2/1995 | Yamamoto et al. |
| 5,488,765 A | * | 2/1996 | Kubota et al. |
| 5,621,619 A | | 4/1997 | Seffernick et al. |
| 5,653,019 A | | 8/1997 | Bernhardt et al. |
| 5,706,579 A | | 1/1998 | Ross |
| 5,724,728 A | | 3/1998 | Bond et al. |
| 5,763,824 A | | 6/1998 | King et al. |
| 5,839,190 A | | 11/1998 | Sullivan |
| 5,844,784 A | | 12/1998 | Moran et al. |
| 5,867,898 A | | 2/1999 | Lauffer et al. |
| 5,898,344 A | | 4/1999 | Hayashi |
| 5,911,356 A | * | 6/1999 | Tsurusaki |
| 5,917,708 A | | 6/1999 | Moran et al. |
| 6,025,998 A | * | 2/2000 | Kitade et al. |
| 6,075,289 A | | 6/2000 | Distefano |
| 6,079,099 A | * | 6/2000 | Uchida et al. |
| 6,230,399 B1 | | 5/2001 | Maheshwari |
| 6,256,877 B1 | | 7/2001 | Hacke et al. |
| 6,263,564 B1 | | 7/2001 | Holmberg et al. |
| 6,388,535 B1 | * | 5/2002 | Otsuki et al. |

FOREIGN PATENT DOCUMENTS

| | | |
|---|---|---|
| CN | 1197327 A | 10/1998 |
| JP | 2-27797 | 1/1990 |

* cited by examiner

*Primary Examiner*—Eric Compton
(74) *Attorney, Agent, or Firm*—Keating & Bennett, LLP

(57) ABSTRACT

A plurality of surface-mounting components are mounted on a mother printed-circuit board provided with component-connecting electrodes, engagement holes, and case-fixing electrodes provided inside the engagement holes. Soldering paste is applied in the vicinity of the engagement holes or in an area covering a portion of each of the engagement holes and the vicinity of the engagement holes on the mother printed-circuit board from the side of the component-mounted surface such that soldering paste is not entirely filled in the engagement hole. A plurality of shielding cases are engaged in the mother printed-circuit board by inserting engagement protrusion portions of the shielding cases into the engagement holes. Then the engagement protrusion portions of the shielding cases are soldered to case-fixing electrodes inside the engagement holes by melting solder in the soldering paste. The mother printed-circuit board is then cut and divided into individual electronic components.

13 Claims, 17 Drawing Sheets

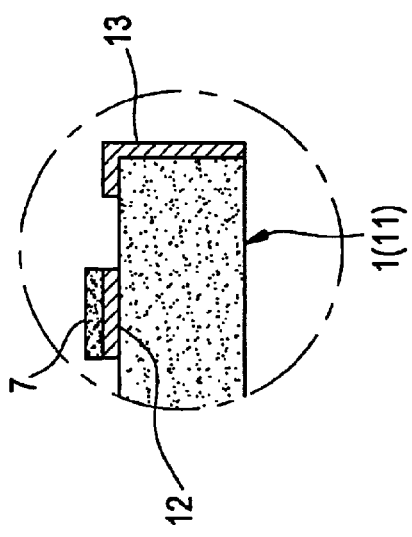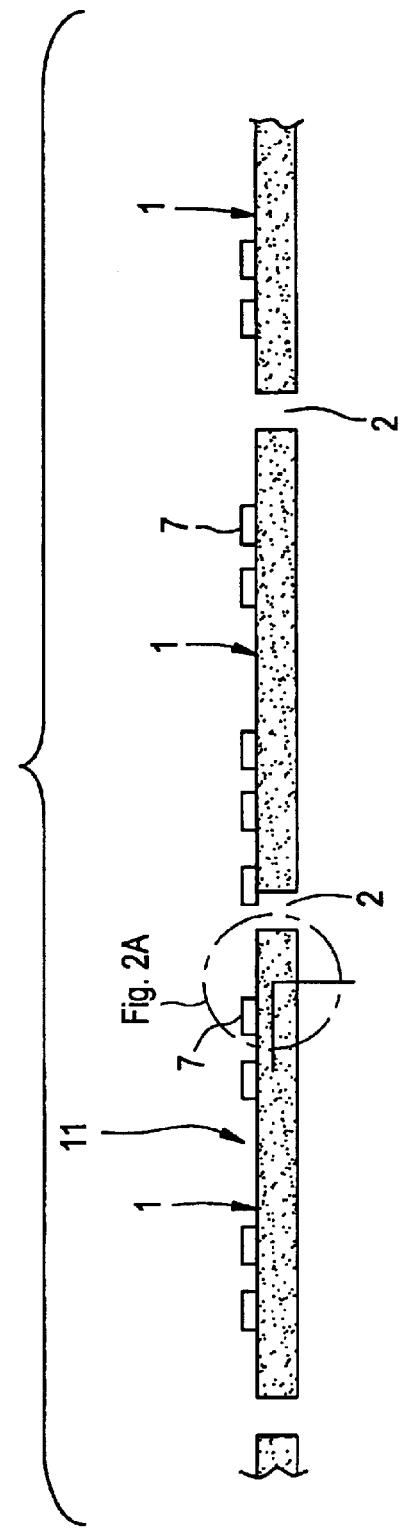

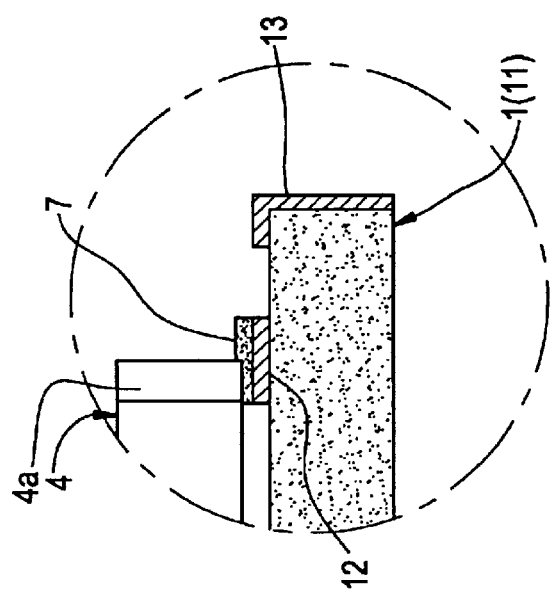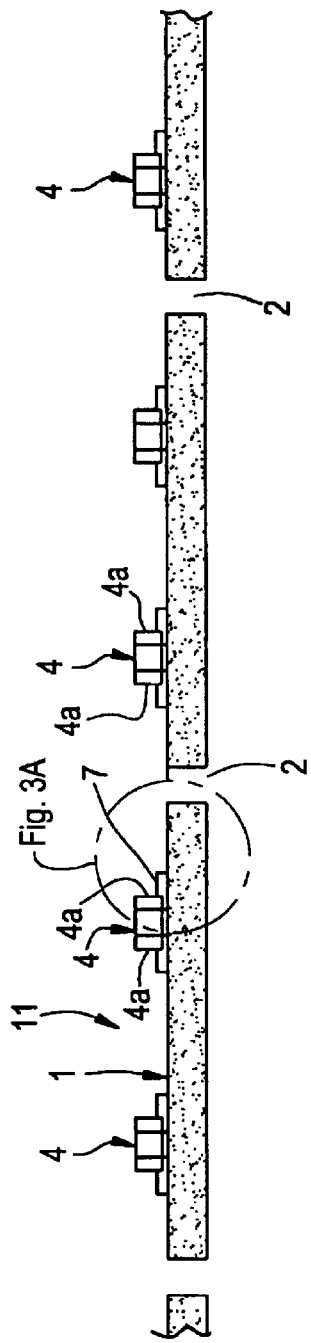

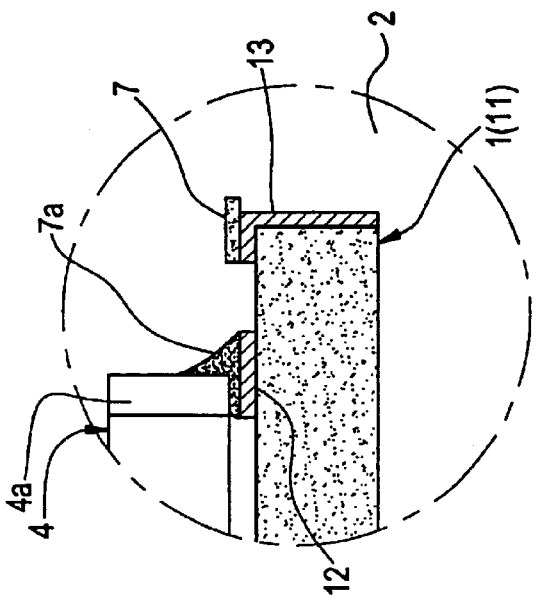

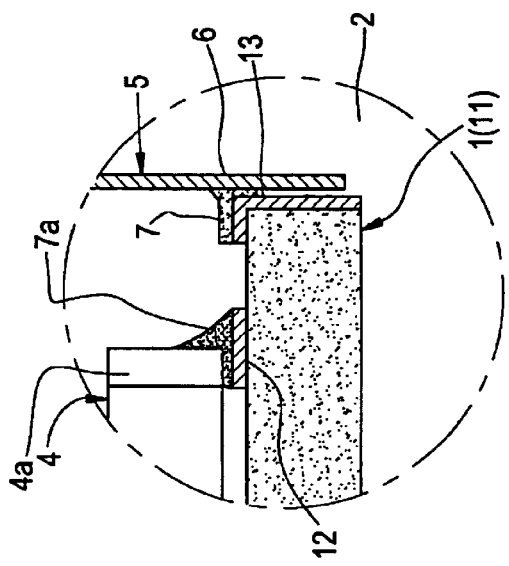
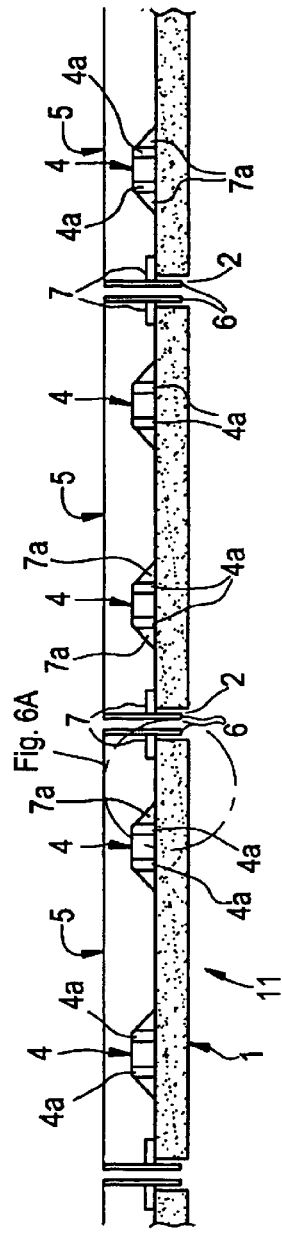
FIG. 6A
FIG. 6B

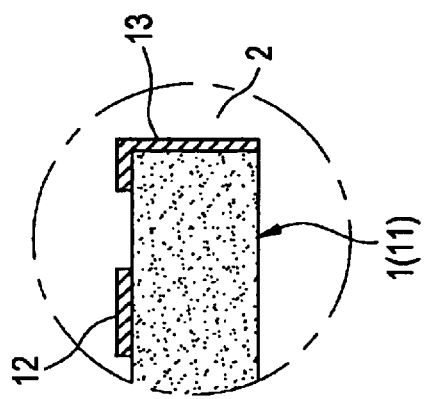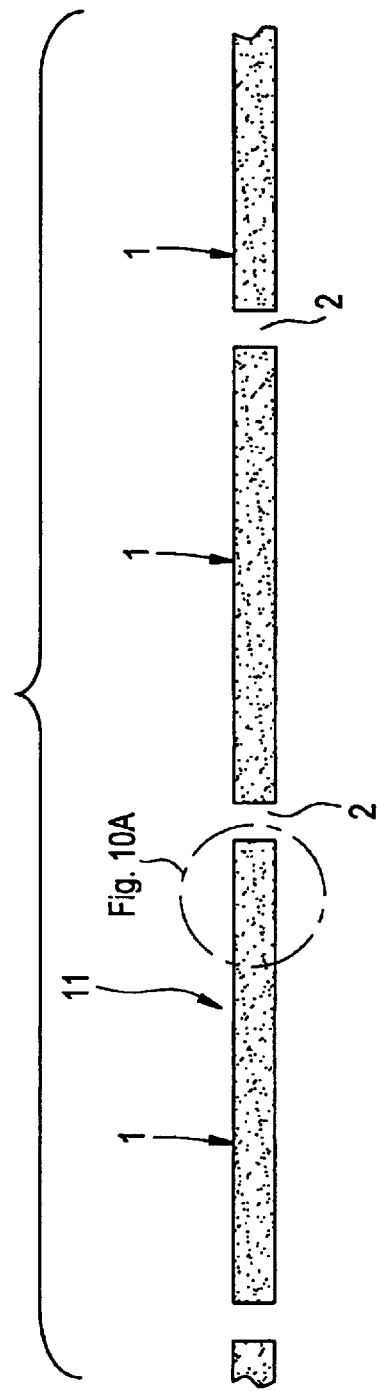

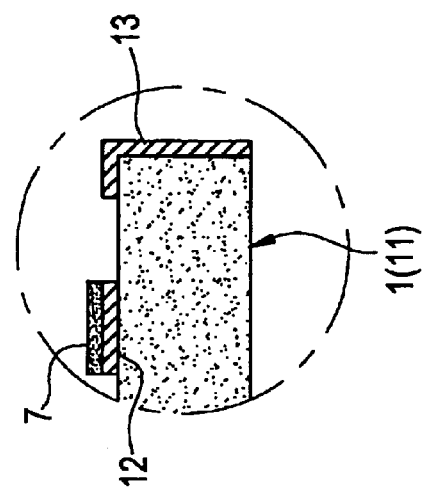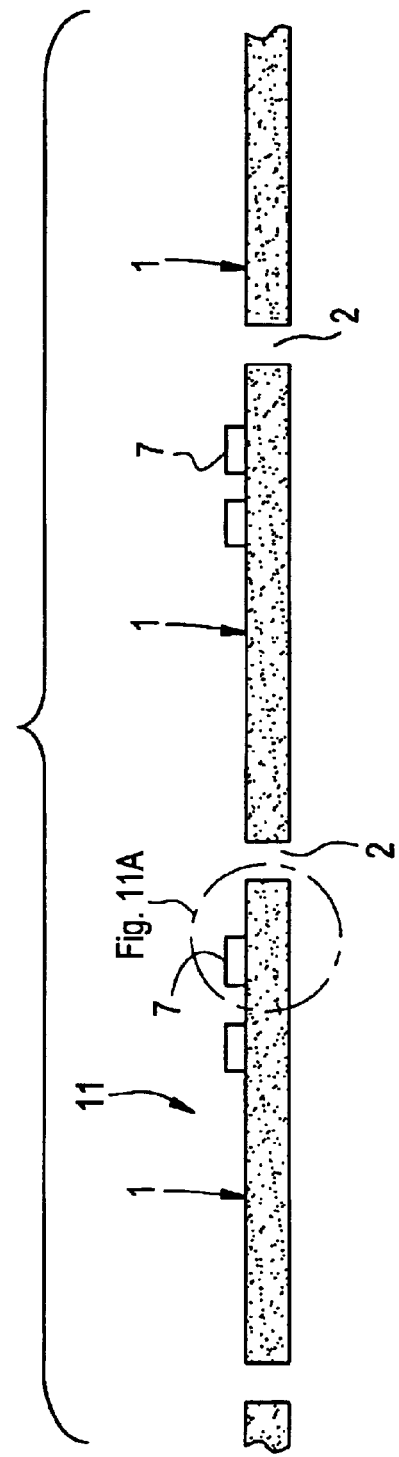

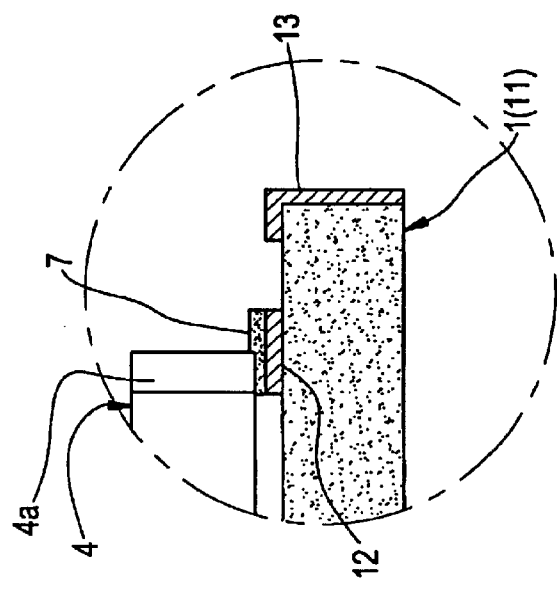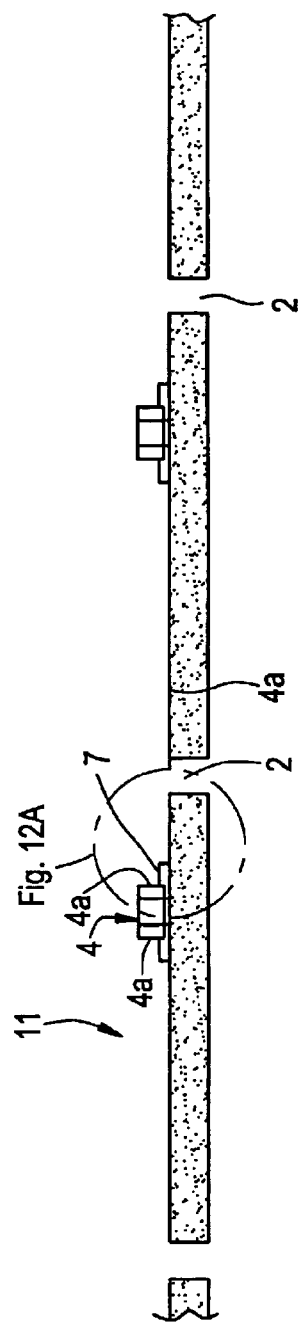

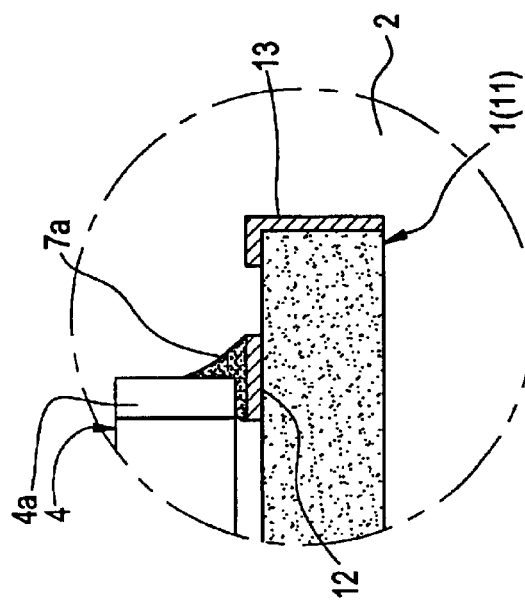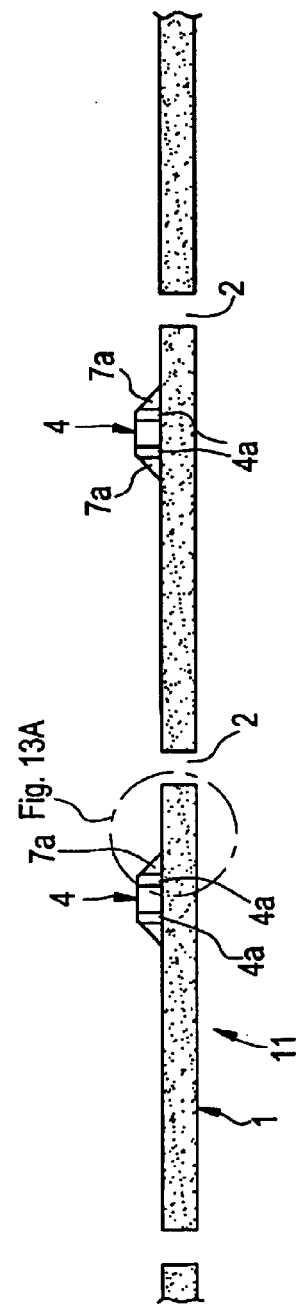

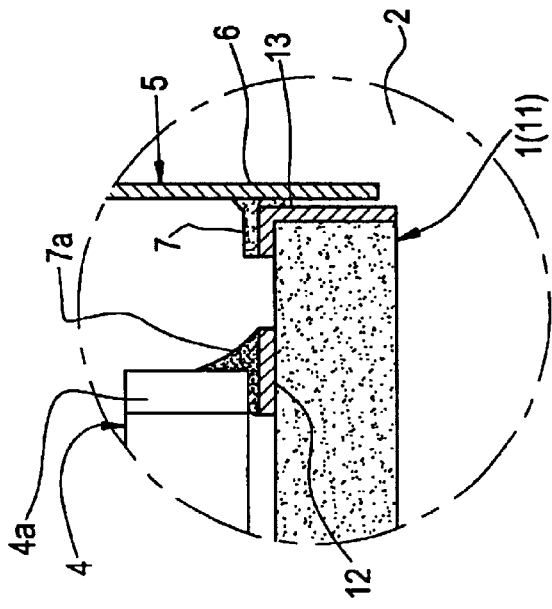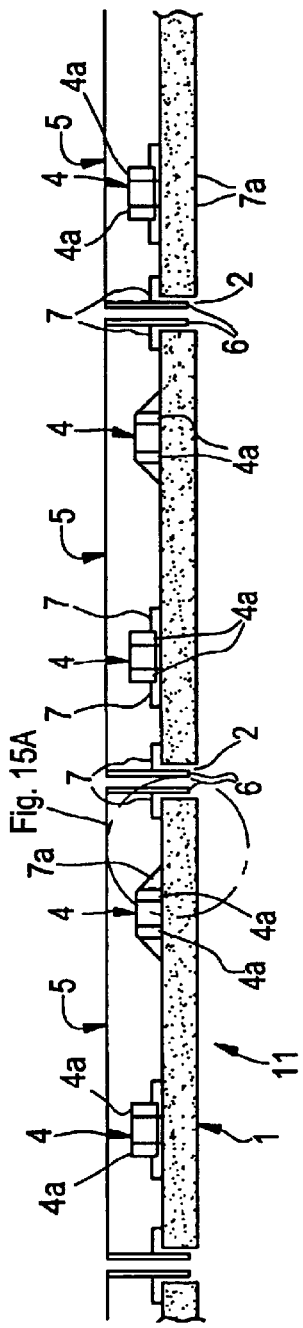

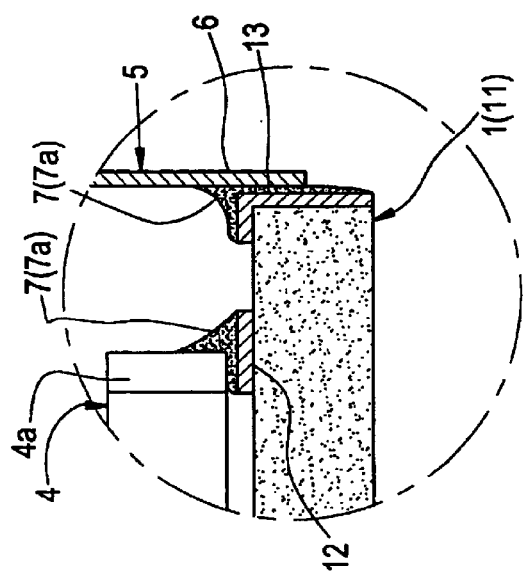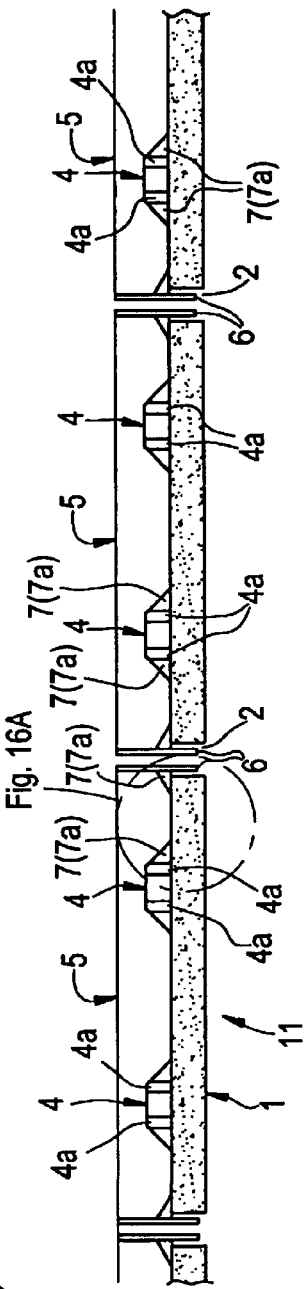

ELECTRONIC COMPONENT AND MANUFACTURING METHOD THEREFOR

BACKGROUND OF THE INVENTION

1. Field of the Invention

The present invention relates to an electronic component and a method of manufacturing the same and more particularly, the present invention relates to electronic components such as high-frequency composite modules used for communications and other uses, and constructed so as to accommodate surface-mounting components inside a shielding case, and a method of manufacturing the same.

2. Description of the Related Art

As an electronic component, for example, as is shown in FIG. 17, there is an electronic component 60 with a shielding case which is constructed such that a surface-mounting component 64 is accommodated inside a shielding case 65 by inserting engagement protrusion portions 66 of the shielding case 65 into concave engagement portions 62 on the inside surface of a printed-circuit board 61. The inside surface of the printed-circuit board 61 has fixing-electrodes (not illustrated) disposed thereon and the surface-mounting component 64 is mounted on the printed-circuit board 61 by fixing the engagement protrusion portions of the shielding case 65 to the fixing-electrodes by solder 67.

In a conventional manufacturing method for an electronic component having a shielding case, soldering paste for mounting components is printed on an aggregate printed-circuit board (mother printed-circuit board) along a large area which is to be divided into a plurality of electronic components, a plurality of surface-mounting components are placed on the mother printed-circuit board, reflow soldering is performed and the surface-mounting components are mounted, then the mother printed-circuit board is divided into individual elements, and then a shielding case is soldered to each of the divided individual elements.

In another method in which through-holes are formed in a mother printed-circuit board, a plurality of surface-mounting components are placed on the mother printed-circuit board, then the through-holes are completely filled with soldering paste, engagement protrusion portions with which each of a plurality of shielding cases is provided are inserted into the through-holes and assembled, the plurality of shielding cases are fixed on the mother printed-circuit board by reflow soldering, and then the mother printed-circuit board is divided into individual electronic components.

However, in the first method described above, since a shielding case is mounted on each of the divided printed-circuit boards, there is a problem of poor production efficiency.

Furthermore, with respect to the second method described above, since soldering paste is generally applied to the engagement holes such that the engagement holes are completely filled with the soldering paste, when the mother printed-circuit board is cut and divided into a plurality of electronic components, the mother printed-circuit board and the solder in the through-holes are cut in the same plane, and accordingly burrs of the solder are produced on the back of the mother printed-circuit board and the solderability at the time of mounting is impaired, dicing cutters are clogged with solder and their life span is shortened, or solder chips produced by dicing stick to products and as a result, the characteristics of the products are decreased.

Furthermore, if the engagement holes are completely filled with solder (soldering paste), the fixing of engagement protrusion portions (for example, nail-like portions) to case-fixing electrodes in the engagement holes cannot be visually confirmed and the reliability is deteriorated, the usage of solder increases and the weight of products is increased, when the condition connected with feeding of soldering paste such as the diameter of engagement holes, the thickness of printed-circuit boards, etc., is changed, adjustments for stabilizing the feeding quantity of soldering paste are required and as a result, there is a problem of reducing productivity.

SUMMARY OF THE INVENTION

In order to overcome the problems described above, preferred embodiments of the present invention provide a method of manufacturing an electronic component by which an electronic component having a construction in which surface-mounting components are accommodated inside a shielding case are efficiently manufactured and electronic components having very high reliability are efficiently manufactured by such a manufacturing method.

In a preferred embodiment of the present invention, a method of method an electronic component having a construction in which surface-mounting components are accommodated inside a shielding case, includes the steps of preparing a mother printed-circuit board on which a plurality of surface-mounting components are to be mounted, the mother printed-circuit board having component-connecting electrodes to which external electrodes of the surface-mounting components are to be connected, engagement holes into which engagement protrusion portions of a shielding case are to be inserted, and case-fixing electrodes provided inside the engagement holes, mounting a plurality of surface-mounting components on the mother printed-circuit board, and connecting external electrodes of the surface-mounting components to the component-connecting electrodes of the mother printed-circuit board, applying soldering paste in the vicinity of the engagement holes on the mother printed-circuit board or in an area covering a portion of the engagement hole and in the vicinity of the engagement holes from the side of the component-mounted surface on which the surface-mounting components have been mounted, such that soldering paste is not entirely filled inside the engagement hole, engaging a plurality of shielding cases with the mother printed-circuit board such that the engagement protrusion portions of the shielding case are inserted into the engagement holes of the mother printed-circuit board, soldering the engagement protrusion portions of the shielding cases to the case-fixing electrodes inside the engagement holes by melting the soldering paste, and then cutting the mother printed-circuit board into areas on each of which a shielding case is mounted and dividing the mother printed-circuit board into a plurality of individual electronic components in each of which surface-mounting components are accommodated inside a shielding case.

With the unique method described in the previous paragraph, it becomes possible to manufacture an electronic component having a construction in which surface-mounting components are accommodated inside a shielding case by mounting a plurality of surface-mounting components on a mother printed-circuit board provided with component-connecting electrodes, engagement holes into which engagement protrusion portions of a shielding case are inserted, and case-fixing electrodes provided inside the engagement holes, connecting external electrodes to the component-connecting electrodes, then applying soldering paste in the vicinity of the engagement holes on the mother printed-circuit board or in an area covering a portion of the engagement hole and the vicinity of the engagement holes from the side of the component-mounted surface such that soldering paste is not entirely filled in the engagement holes, making a plurality of shielding cases engaged in the mother printed-circuit board, then soldering the engagement protrusion portions of the shielding cases to case-fixing electrodes inside the engagement holes by melting solder in the soldering paste, and then cutting the mother printed-circuit board and dividing the mother printed-circuit board into separate electronic components.

That is, since the shielding cases are mounted in the stage of a mother printed-circuit board, production efficiency is greatly improved when compared with the case in which the shielding cases are mounted on each of divided printed-circuit boards.

Furthermore, since the engagement holes are not completely filled with soldering paste, the advantages described in the following paragraphs are achieves.

Since the engagement holes are not entirely filled with solder (soldering paste), when the mother printed-circuit board is cut into areas on each of which a shielding case is mounted and divided into a plurality of individual electronic components, the mother printed-circuit board and the solder inside the through-holes are not cut in the same plane. As a result, burrs of solder are not formed on the back of the printed-circuit boards and thus, the solderability at the time of mounting of products is not deteriorated.

When the mother printed-circuit board is cut by dicing cutters, the cutters can be prevented from being clogged with solder, and the lifespan of the cutters is prevented from being shortened.

Solder chips produced by dicing do not stick to products and thus, excellent characteristics of the products are achieved.

The usage of solder is reduced and it becomes possible to make the weight of products lighter.

Even if the condition related to feeding of soldering paste such as the diameter of engagement holes, the thickness of printed-circuit boards, and other characteristics, is changed, adjustments for stabilizing the feeding quantity of soldering paste are not required and increased productivity is achieved.

Since the engagement holes in printed-circuit boards are not entirely filled with solder (soldering paste), it becomes possible to visually confirm the fixing of engagement protrusion portions (for example, nail-like protrusions) to case-fixing electrodes in the engagement holes.

Moreover, in preferred embodiments of the present invention, the statement that soldering paste is applied such that soldering paste is not entirely filled in the engagement holes is a concept meaning that soldering paste is supplied so that soldering paste does not substantially fill the main portion of engagement holes, and the entrance of a small quantity of soldering paste into engagement holes is not excluded.

Furthermore, according to another preferred embodiment of the present invention, a method of manufacturing an electronic component having a construction in which surface-mounting components are accommodated inside a shielding case, includes the steps of preparing a mother printed-circuit board on which a plurality of surface-mounting components are to be mounted, the mother printed-circuit board provided with component-connecting electrodes to which external electrodes of the surface-mounting components are to be connected, engagement holes into which engagement protrusion portions of a shielding case are to be inserted, and case-fixing electrodes provided inside the engagement holes, mounting a portion of a predetermined number of surface-mounting components on the mother printed-circuit board and connecting external electrodes of the surface-mounting components to the component-connecting electrodes of the mother printed-circuit board, applying soldering paste to component-connecting electrodes on which surface-mounting components are not mounted yet, and applying soldering paste in the vicinity of the engagement holes or in an area covering a portion of the engagement hole and the vicinity of the engagement holes on the mother printed-circuit board, from the side of the component-mounted surface on which the surface-mounting components have been mounted, such that soldering paste is not entirely filled inside the engagement hole, placing the surface-mounting components which are not mounted yet on the mother printed-circuit board such that the external electrodes of the surface-mounting components not mounted yet are opposed to the soldering paste applied on the component-connecting electrodes, engaging a plurality of shielding cases with the mother printed-circuit board such that the engagement protrusion portions of shielding cases are inserted into the engagement holes of the mother printed-circuit board, soldering the external electrodes of the surface-mounting components put on the mother printed-circuit board later to the component-connecting electrodes and soldering the engagement protrusion portions of the shielding cases to case-fixing electrodes inside the engagement holes by melting the soldering paste, and then cutting the mother printed-circuit board into areas on each of which a shielding case is mounted and dividing the mother printed-circuit board into a plurality of individual electronic components in each of which surface-mounting components are accommodated inside a shielding case.

With the unique method of manufacturing described in the preceding paragraph, the same advantages achieved by the manufacturing method for an electronic component according to the above-described first preferred embodiment of the present invention is achieved, and since the mounting process of surface-mounting components is separated into two, other processes can be performed between the two mounting processes and accordingly the freedom of the manufacturing processes is greatly improved.

Furthermore, in another preferred embodiment of a method of manufacturing an electronic component of the present invention, a land electrode to be electrically connected to a shielding case is provided in the vicinity of an engagement hole on the component-mounted surface of the mother printed-circuit board and a portion of the shielding case and the land electrode are constructed so as to be connected to each other preferably via soldering.

By providing a land electrode to be electrically connected to a shielding case in the vicinity of a engagement hole on the component-mounted surface of a printed-circuit board and by connecting a portion of the shielding case to the land electrode preferably via soldering, it becomes possible to increase the reliability of electrical connection, and accordingly it becomes possible to make the present invention even more effective.

That is, since the engagement protrusion portions of a shielding case are fixed to the case-fixing electrodes inside engagement holes of a printed-circuit board, the mechanical connection of the shielding case to the printed-circuit board is securely and reliably achieved, and since the shielding case is connected to the land electrode through soldering, the electrical connection between the shielding case and the printed-circuit board is securely and reliably achieved. Accordingly, it becomes possible to increase the reliability of both mechanical and electrical connection and as a result, the reliability as a whole is greatly improved.

In an electronic component according to another preferred embodiment of the present invention, surface-mounting components are soldered to component-connecting electrodes on a printed-circuit board and a shielding case that is provided to accommodate surface-mounting components is soldered to case-fixing electrodes provided on the internal surface of concave portions on the side of the printed-circuit board by a very small quantity of solder that occupies a portion inside of the concave portion.

An electronic component according to another preferred embodiment of the present invention is manufactured by a manufacturing method for an electronic component according other preferred embodiments of the present invention, and since a shielding case is securely fixed to a case-fixing electrode provided in a printed-circuit board, very high reliability is achieved. Furthermore, it is possible to efficiently manufacture this electronic component via the above-described preferred embodiments of the manufacturing method of the present invention.

Other features, characteristics, elements and advantages of the present invention will become apparent from the following detailed description of the preferred embodiments thereof with reference to the attached drawings.

BRIEF DESCRIPTION OF THE DRAWINGS

FIG. 2 shows another step in a method of manufacturing an electronic component having a shielding case according to the first preferred embodiment of the present invention;

FIG. 3 shows another step in a method of manufacturing an electronic component with a shielding case according to the first preferred embodiment of the present invention;

FIG. 5 shows another step in a method of manufacturing an electronic component having a shielding case according to the first preferred embodiment of the present invention;

FIG. 6 shows another step in a method of manufacturing an electronic component having a shielding case according to the first preferred embodiment of the present invention;

FIG. 10 shows one step in a method of manufacturing an electronic component having a shielding case according to a second preferred embodiment of the present invention;

FIG. 11 shows another step in a method of manufacturing an electronic component having a shielding case according to a second preferred embodiment of the present invention;

FIG. 12 shows another step in a method of manufacturing an electronic component having a shielding case according to a second preferred embodiment of the present invention;

FIG. 13 shows another step in a method of manufacturing an electronic component having a shielding case according to a second preferred embodiment of the present invention;

FIG. 15 shows another step in a method of manufacturing an electronic component having a shielding case according to a second preferred embodiment of the present invention;

FIG. 16 shows another step in a method of manufacturing an electronic component having a shielding case according to a second preferred embodiment of the present invention.

DETAILED DESCRIPTION OF PREFERRED EMBODIMENTS

Hereinafter, by showing preferred embodiments of the present invention, the distinguishing features of the present invention will be described in detail.

A method of manufacturing an electronic component (for example, a high-frequency electronic component such as a voltage-controlled oscillator (VCO), or other suitable component, preferably used in communications equipment) will be described with reference to FIGS. 1 to 9.

First of all, as shown in FIG. 6, a mother printed-circuit board 11 (FIG. 1) on which surface-mounting components 4 and shielding cases 5 are mounted is prepared. Moreover, this mother printed-circuit board 11 is an aggregate of printed-circuit boards 1 constituting individual products and is a printed-circuit board which is to be divided into a plurality of individual electronic components.

Figure 1A:
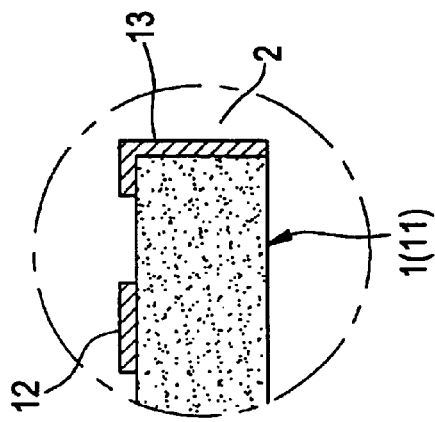
FIG. 1 shows one step in a method of manufacturing an electronic component having a shielding case according to a first preferred embodiment of the present invention.
Figure 1B:
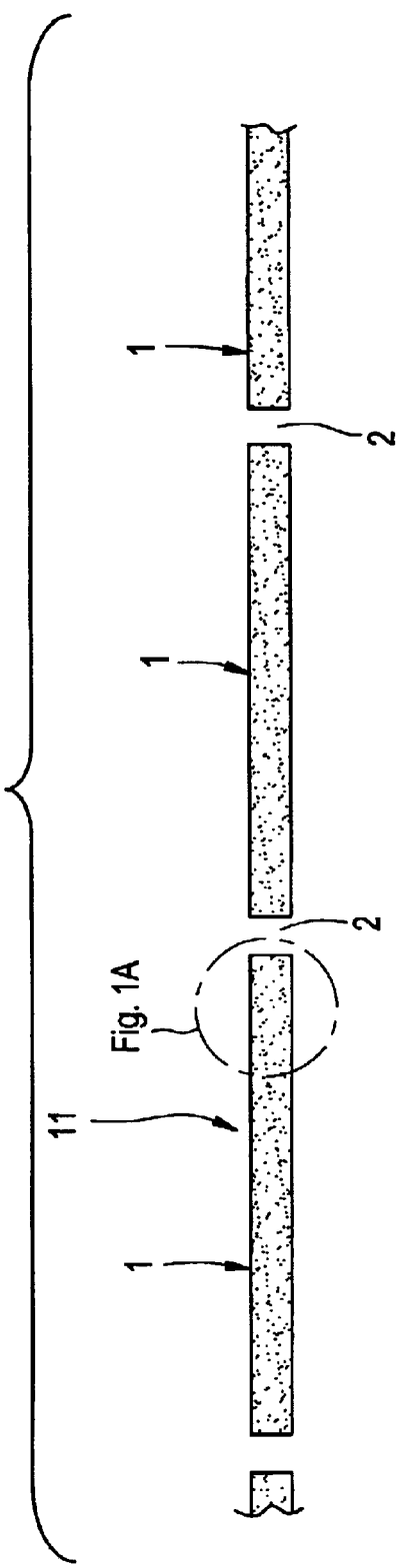
Figure 4A:
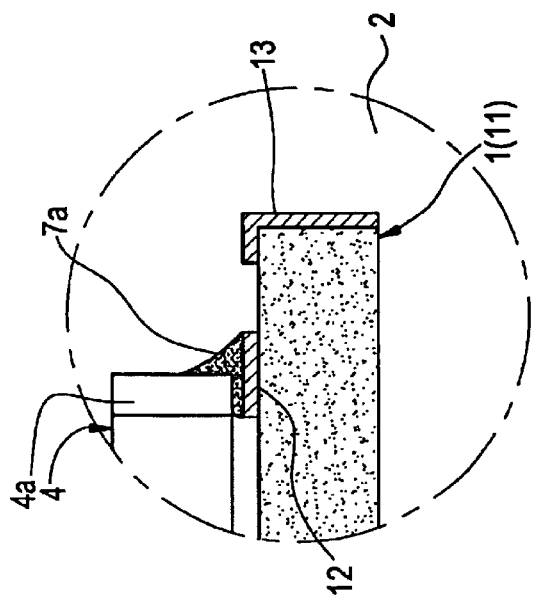
FIG. 4 shows another step in a method of manufacturing an electronic component having a shielding case according to the first preferred embodiment of the present invention.
Figure 4B:
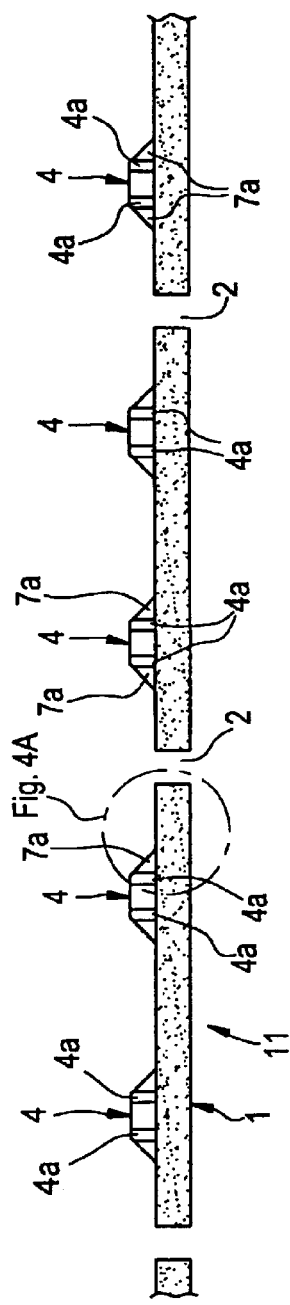
Figure 7A:
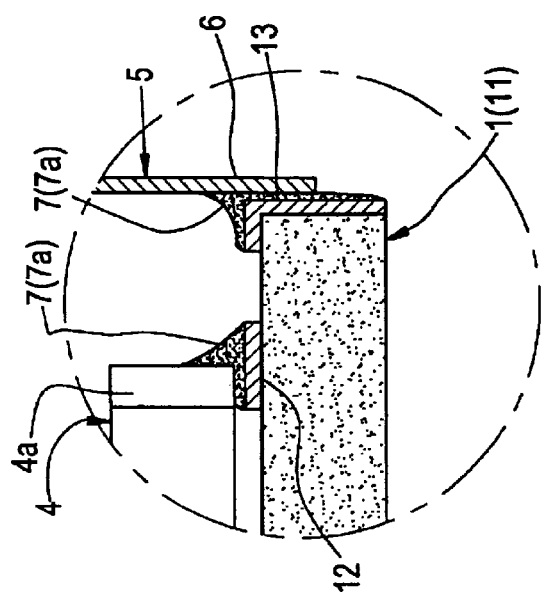
FIG. 7 shows another step in a method of manufacturing an electronic component having a shielding case according to the first preferred embodiment of the present invention.
Figure 7B:
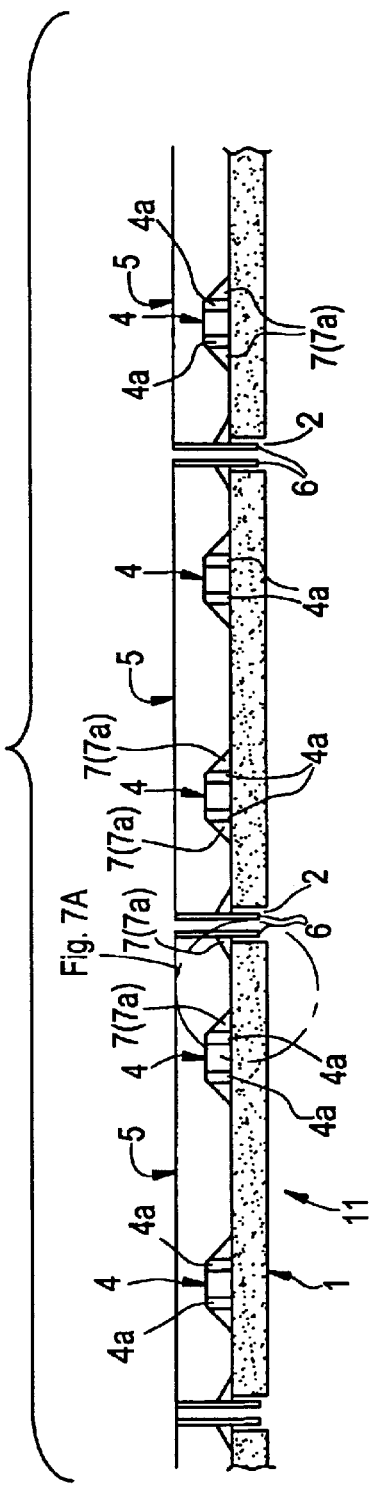

On one surface (upper surface in this preferred embodiment) of the mother printed-circuit board 11 (FIG. 1), component-connecting electrodes 12 to which surface-mounting components 4 are electrically and mechanically connected and which constitute a portion of wiring patterns are provided. Furthermore, in the mother printed-circuit board 11, engagement holes 2 into which engagement protrusion portions (nail-like protrusions) 6 of a shielding case 5 are to be inserted, for example, as is shown in FIGS. 6 and 7, are formed. On the inner surface of this engagement hole 2, an electrode (case-fixing electrode) 13 to which an engagement protrusion portion 6 of the shielding case 5 is soldered is disposed. Moreover, the electrode 13 is extended to the circumference of the engagement hole 2 on the upper surface of the mother printed-circuit board 11 and the portion extended to the upper surface of the mother printed-circuit board defines a land electrode to be electrically connected to the shielding case.

On the component-connecting electrodes 12 to which surface-mounting components 4 are to be electrically and mechanically connected, on the upper surface of the mother printed-circuit board 11, soldering paste 7 is applied as shown in FIG. 2.

Moreover, it is possible to apply soldering paste 7 by coating the paste 7 using a coating machine or by printing the paste 7 using a screen printing machine, and no restrictions are put on the particular applying method to be used.

As is shown in FIG. 3, a plurality of surface-mounting components 4 are mounted on the soldering pastes applied on the component-connecting electrodes 12. At this time, the surface-mounting components 4 are mounted so that the external electrode 4a comes in full contact with the soldering paste 7. Moreover, the surface-mounting components 4 are preferably mounted by generally using an automatic mounting unit.

The mother circuit-printed board 11 with the surface-mounting components 4 mounted thereon is put into a reflow soldering furnace, and after soldering paste 7 has been melted, and cooled to become the solder 7a (FIG. 4), the external electrode 4a of the surface-mounting component 4 is soldered to the component-connecting electrode 12.

Then, as is shown in FIG. 5, soldering paste 7 for electrically and mechanically connecting the engagement protrusion portions 6 of a shielding case 5 in which surface-mounting components 4 are to be accommodated to the case-connecting electrodes 13 and for fixing the engagement protrusion portions 6 is applied to an area covering at least a portion of an engagement hole 2 and the vicinity of the engagement hole 2 from the component-mounted surface on which the surface-mounting components 4 are mounted such that the soldering paste 7 is not entirely filled into the engagement hole 2.

Next, as is shown in FIG. 6, a plurality of shielding cases 5 are mounted on the mother printed-circuit board such that predetermined surface-mounting components 4 are accommodated inside of a shielding case 5.

At this time, the shielding cases are mounted such that the engagement protrusion portions 6 of the shielding case 5 fit into the engagement holes 2 of the mother printed-circuit board 11. Moreover, in this preferred embodiment, the engagement protrusion portions 6 are arranged not to extend beyond the back surface of the mother printed-circuit board 11 through the engagement holes 2.

Figure 8:
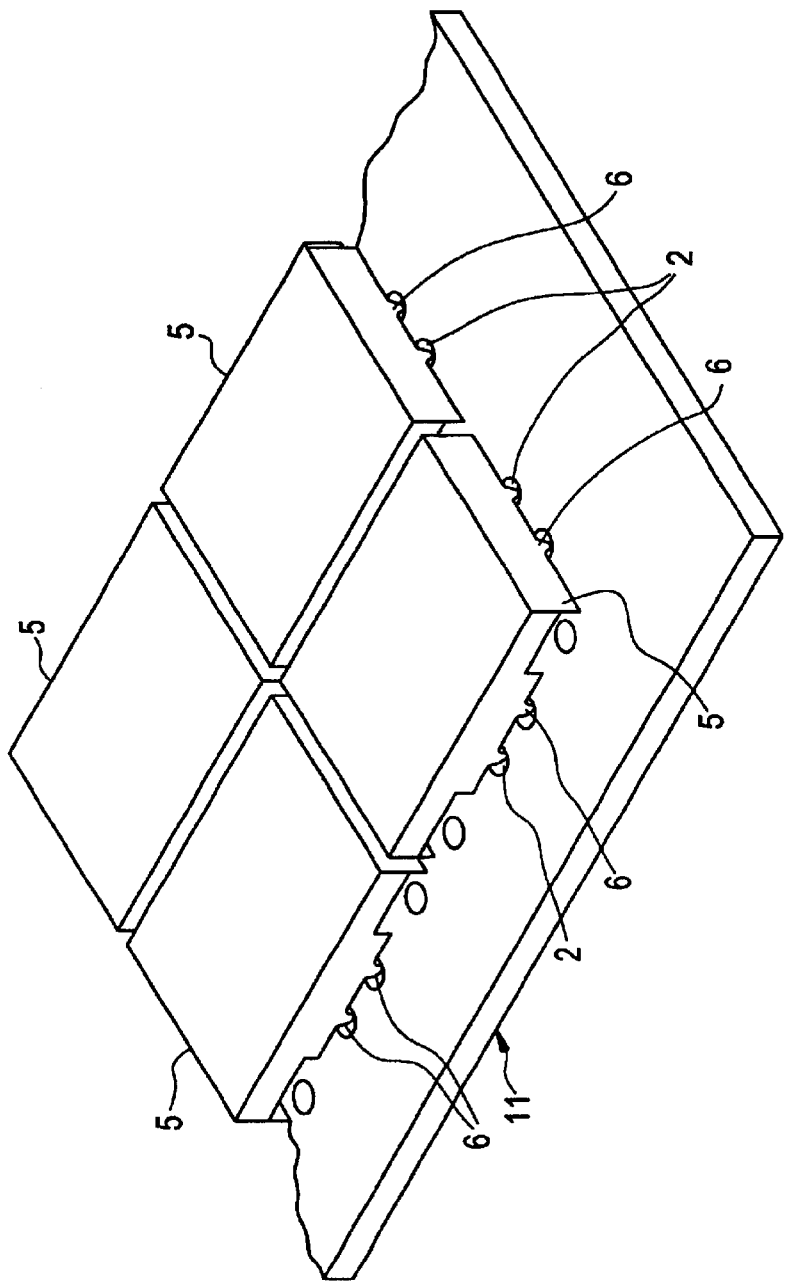
FIG. 8 is a perspective view showing a plurality of shielding cases mounted on a mother board in a method of manufacturing an electronic component having a shielding case according to the first preferred embodiment of the present invention.

Then, after the mother printed-circuit board 11 with the shielding cases 5 mounted thereon is put into a reflow soldering furnace and the soldering paste 7 has been melted and is cooled to become the solder 7a, and the engagement protrusion portions 6 of the shielding cases 5 are soldered to the case-fixing electrodes 13 of the mother printed-circuit board 11 (FIG. 7). Moreover, FIG. 8 shows the state in which a plurality of shielding cases 5 are mounted on a mother printed-circuit board 11. Moreover, in FIG. 8, solder (soldering paste) is not shown for easier understanding.

Figure 9:
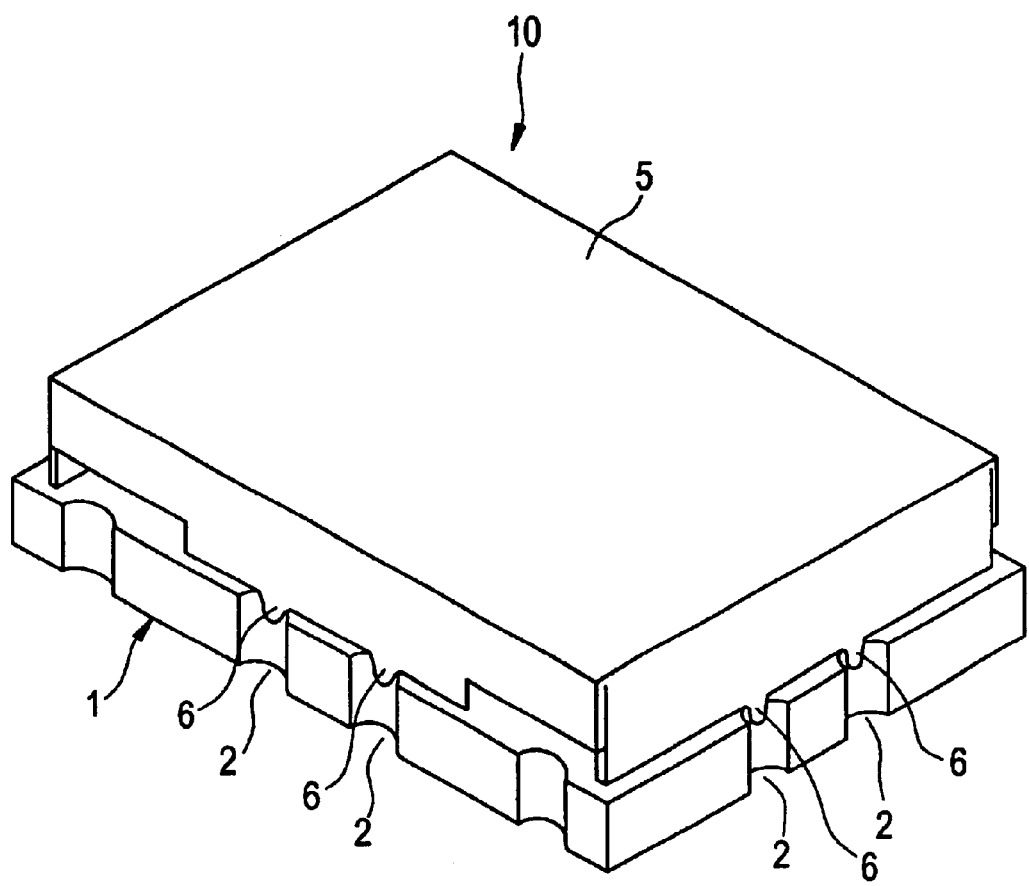
FIG. 9 is a perspective view showing an electronic component obtained by cutting and dividing a mother board with surface-mounting components and shielding cases soldered thereto in a method of manufacturing an electronic component having a shielding case according to the first preferred embodiment of the present invention.

Then, the mother printed-circuit board in which a plurality of surface-mounting components and shielding cases are mounted and soldered, is cut and divided into areas on each of which a shielding case is mounted, and, as is shown in FIG. 9, separate electronic components 10 in which surface-mounting components (not illustrated) are accommodated inside a shielding case 5 can be obtained. Moreover, also in FIG. 9, solder is not shown for easier understanding.

According to the above-described method, a plurality of surface-mounting components 4 are mounted on a mother printed-circuit board 11 and external electrodes 4a are connected to component-connecting electrodes 12. Then soldering paste 7 is applied to an area covering at least a portion of each of engagement holes 2 and the vicinity of the engagement hole 2 on the mother printed-circuit board 11 from the side of the part-mounting surface such that the engagement hole 2 is not entirely filled with the soldering paste 7 and a plurality of shielding cases 5 are engaged with the mother printed-circuit board 11 such that the engagement protrusion portions 6 of the shielding case 5 are inserted in the engagement holes of the mother printed-circuit board 11. Then the mother printed-circuit board 11 is put in a reflow soldering furnace and soldering paste 7 is melted and thus, the engagement protrusion portions 6 of the shielding case 5 are soldered to the case-fixing electrodes 13 inside the engagement holes 2. After, the mother printed-circuit board is cut into areas on each of which a shielding case 5 is mounted and divided into separate electronic components in each of which surface-mounting components 4 are accommodated inside a shielding case 5. Accordingly, it is possible to efficiently manufacture electronic components having a construction in which surface-mounting components 4 are accommodated in a shielding case.

Furthermore, since, in the state of a mother printed-circuit board that is to be divided into a plurality of electronic components, soldering paste 7 is intended to be applied, it becomes possible to improve the accuracy of the supplying location and supplying quantities of soldering paste and to manufacture electronic components efficiently without restrictions imposed by the size of individual products. As a result, it becomes possible to use small-scale plants and equipment and reduced-area workshops.

Furthermore, since shielding cases 5 are connected to electrodes (land electrodes) formed in the vicinity of engagement holes through solder 7a, the electrical connection between shielding cases 5 and the printed-circuit board 1 (mother printed-circuit board 11) is securely established. As a result, the reliability of both the mechanical connection and electrical connection and the reliability as a whole are all greatly improved.

Now, another preferred embodiment of the present invention will be described. First, as is shown in FIG. 16, a mother printed-circuit board 11 (FIG. 10) on which surface-mounting components 4 and shielding cases 5 are mounted is prepared. Moreover, this mother printed-circuit board 11 is preferred an aggregate of printed-circuit boards constituting individual products, and since it is constructed in the same way as in the above-mentioned first preferred embodiment, the description of the detailed construction is omitted to avoid repetition.

On a predetermined number of component-connecting electrodes 12 corresponding to a portion of a predetermined number of surface-mounting components 4 to be mounted on the mother printed-circuit board 11, as is shown in FIG. 11, soldering paste 7 is applied.

Next, the surface-mounting components 4 are mounted (FIG. 12) on the predetermined component-connecting electrodes 12 with the soldering paste 7 applied thereon, it is put into a reflow soldering furnace, and after the soldering paste has been melted and cooled, the external electrodes 4a of the predetermined surface-mounting components 4 are soldered to the predetermined component-connecting electrodes 12 (FIG. 13).

Figure 14A:
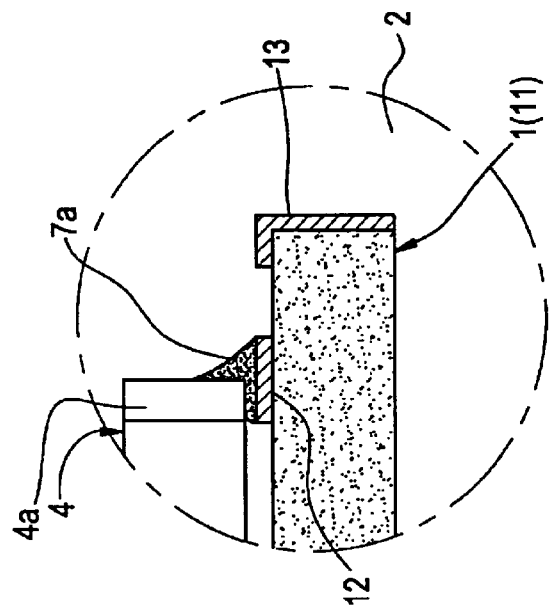
FIG. 14 shows another step in a method of manufacturing an electronic component having a shielding case according to a second preferred embodiment of the present invention.
Figure 14B:
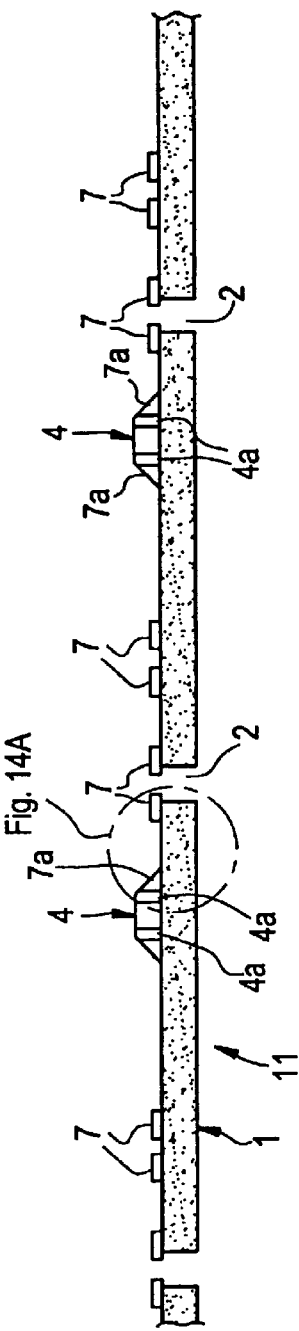
Figure 17:
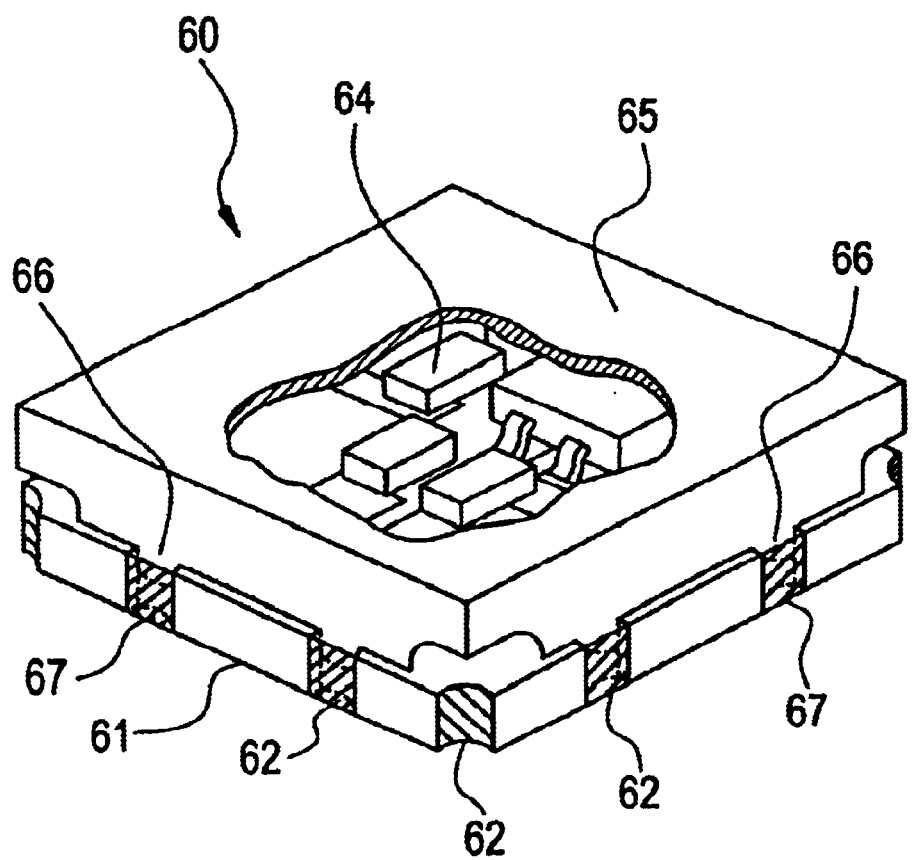
FIG. 17 a perspective view showing a conventional electronic component with a shielding case.

Then, as is shown in FIG. 14, from the side of the component-mounted surface on which the surface-mounting components 4 have been mounted, soldering paste 7 is applied on component-connecting electrodes 12 where no surface-mounting components are mounted, and soldering paste 7 is applied to an area covering at least a portion of each of engagement holes 2 and the vicinity of the engagement holes 2 such that the soldering paste 7 is not entirely filled into the engagement holes 2.

Then, as is shown in FIG. 15, surface-mounting components 4 which are not mounted yet are placed and held on the mother printed-circuit board 11 such that their external electrodes 4a are opposed to soldering paste 7 applied on the component-connecting electrodes 12, and a plurality of shielding cases 5 are engaged with the mother printed-circuit board 11 such that the engagement protrusion portions 6 of the shielding cases 5 are inserted into the engagement holes 2 of the mother printed-circuit board 11.

Next, by putting the mother printed-circuit board 11 with the shielding cases 5 engaged therewith in a reflow soldering furnace and melting soldering paste 7 into solder 7a, as is shown in FIG. 16, the external electrodes 4a of the surface-mounting components 4 which was placed and held later on the mother printed-circuit board 11 are soldered to the component-connecting electrodes 12 and the engagement protrusion portions 6 of the shielding cases 5 are soldered to the case-fixing electrodes 13 inside the engagement holes 2.

After that, by cutting and dividing the mother printed-circuit board with the plurality of surface-mounting components and the shielding cases mounted thereon and soldered thereto into areas on each of which a shielding case is mounted, individual electronic components in which the surface-mounting components are accommodated inside a shielding case can be obtained.

In the second preferred embodiment, the same advantages as achieved in the first preferred embodiment are achieved, and since the mounting process of surface-mounting components is separated into two, other processes can be inserted between the two mounting processes. Accordingly, the freedom of the manufacturing processes is greatly increased.

Moreover, in the above-described preferred embodiments, the manufacture of high-frequency electronic components such as VCOs, and other components, to be used in communication devices and other apparatuses, was described, as an example, but the present invention can be also applied to the manufacture of electronic components of other types.

The present invention is also not limited to the above-described preferred embodiments in other respects. For example, the shape of printed-circuit boards, the pattern of component-connecting electrodes and case-fixing electrodes, shielding cases, and the specific shape and construction of the engagement protrusion portions of the shielding cases, and other elements made be varied and modified without departing from the spirit and scope of the present invention.

While preferred embodiments of the invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A method of manufacturing an electronic component having a construction in which surface-mounting components are accommodated inside a shielding case, the method comprising the steps of:

preparing a mother printed-circuit board on which a plurality of surface-mounting components are to be mounted, the mother printed-circuit board provided with component-connecting electrodes to which external electrodes of the surface-mounting components are to be connected, engagement holes into which engagement protrusion portions of a shielding case are to be inserted, and case-fixing electrodes provided inside the engagement holes and on the mother printed-circuit board;

mounting a plurality of surface-mounting components on the mother printed-circuit board and connecting external electrodes of the surface-mounting components to the component-connecting electrodes of the mother printed-circuit board;

applying soldering paste such that soldering paste is not entirely filled inside the engagement hole and is provided on at least a portion of the case-fixing electrodes provided on the mother printed-circuit board;

engaging a plurality of shielding cases with the mother printed-circuit board such that the engagement protrusion portions of the shielding case are inserted into the engagement holes of the mother printed-circuit board;

soldering the engagement protrusion portions of the shielding cases to the case-fixing electrodes inside the engagement holes by melting the soldering paste; and cutting the mother printed-circuit board into areas on each of which a shielding case is mounted and dividing the mother printed-circuit board into a plurality of individual electronic components in each of which surface-mounting components are accommodated inside a shielding case; wherein the engagement protrusion portions of the shielding cases are inserted into the engagement holes of the mother printed-circuit board from a aide of the mother printed-circuit board on which the soldering paste is applied.

2. The method according to claim 1, wherein the electronic component is a voltage controlled oscillator.

3. The method according to claim 1, wherein the electronic component is adapted for use in communications devices.

4. The method according to claim 1, wherein the mother printed-circuit board comprises an aggregate of a plurality of printed-circuit boards.

5. The method according to claim 1, wherein the step of applying soldering paste is performed by one of coating the paste using a coating machine and by printing the paste using a screen printing machine.

6. A method according to claim 1, wherein a land electrode to be electrically connected to the shielding case is provided in the vicinity of the engagement hole on the component-mounted surface of the mother printed-circuit board, and a portion of the shielding case and the land electrode are connected to each other via soldering.

7. A method of manufacturing an electronic component having a construction in which surface-mounting components are accommodated inside a shielding case, the method comprising the steps of:

preparing a mother printed-circuit board on which a plurality of surface-mounting components are to be mounted, the mother printed-circuit board provided with component-connecting electrodes to which external electrodes of the surface-mounting components are to be connected, engagement holes into which engagement protrusion portions of a shielding case are to be inserted, and case-fixing electrodes provided inside the engagement holes and on the mother printed-circuit board;

mounting a first portion of a predetermined number of surface-mounting components on the mother printed-circuit board and connecting external electrodes of the surface-mounting components to the component-connecting electrodes of the mother printed-circuit board;

applying soldering paste to component-connecting electrodes on which surface-mounting components are not yet mounted, and applying soldering paste such that soldering paste is not entirely filled inside the engagement hole and is provided on at least a portion of the case-fixing electrodes provided on the mother printed-circuit board;

placing a second portion of the surface-mounting components which are not yet mounted on the mother printed-circuit board such that the external electrodes of the surface-mounting components are opposed to the soldering paste applied on the component-connecting electrodes;

engaging a plurality of shielding cases with the mother printed-circuit board such that the engagement protrusion portions of the shielding case are inserted into the engagement holes of the mother printed-circuit board;

soldering the external electrodes of the second portion of surface-mounting components put on the mother printed-circuit board subsequent to the first portion to the component-connecting electrodes, and soldering the engagement protrusion portions of the shielding cases to case-fixing electrodes inside the engagement holes by melting the soldering paste; and cutting the mother printed-circuit board into areas on each of which a shielding case is mounted, and dividing the mother printed-circuit board into a plurality of individual electronic components in each of which surface-mounting components are accommodated inside a shielding case; wherein the engagement protrusion portions of the shielding cases are inserted into the engagement holes of the mother printed-circuit board from a side of the mother printed-circuit board on which the soldering paste is applied.

8. The method according to claim 7, wherein additional processing steps are performed between the steps of placing the first portion of the surface-mounting components on the mother printed-circuit board and placing the second portion of the surface-mounting components on the mother printed-circuit board.

9. The method according to claim 7, wherein the electronic component is a voltage controlled oscillator.

10. The method according to claim 7, wherein the electronic component is adapted for use in communications devices.

11. The method according to claim 7, wherein the mother printed-circuit board comprises an aggregate of a plurality of printed-circuit boards.

12. The method according to claim 7, wherein the step of applying soldering paste is performed by one of coating the paste using a coating machine and by printing the paste using a screen printing machine.

13. A method according to claim 7, wherein a land electrode to be electrically connected to the shielding case is provided in the vicinity of the engagement hole on the component-mounted surface of the mother printed-circuit board, and a portion of the shielding case and the land electrode are connected to each other via soldering.

* * * * *